United States Patent
Shen et al.

(10) Patent No.: US 11,531,439 B1
(45) Date of Patent: Dec. 20, 2022

(54) MULTI-FREQUENCY-REGION TOUCH SENSING

(71) Applicant: Synaptics Incorporated, San Jose, CA (US)

(72) Inventors: Guozhong Shen, San Jose, CA (US); Chunbo Liu, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 17/518,307

(22) Filed: Nov. 3, 2021

(51) Int. Cl.
*G06F 3/044* (2006.01)
*H03M 1/12* (2006.01)
*G06F 3/041* (2006.01)

(52) U.S. Cl.
CPC ........ *G06F 3/0446* (2019.05); *G06F 3/04166* (2019.05); *H03M 1/12* (2013.01)

(58) Field of Classification Search
CPC .................................................. G06F 3/0446
See application file for complete search history.

(56) References Cited

U.S. PATENT DOCUMENTS

| | | | |
|---|---|---|---|
| 8,493,331 B2 * | 7/2013 | Krah | G06F 3/0416 345/173 |
| 9,256,329 B1 | 2/2016 | Shen et al. | |
| 9,740,354 B2 * | 8/2017 | Schwartz | G06F 3/04166 |
| 11,144,161 B1 * | 10/2021 | Pundak | G06F 3/1423 |

* cited by examiner

*Primary Examiner* — Robin J Mishler
(74) *Attorney, Agent, or Firm* — Ferguson Braswell Fraser Kubasta PC (57) ABSTRACT

An input device includes transmitter electrodes disposed in a sensing region of the input device, a receiver electrode in the sensing region, and a processing system. The processing system includes demodulators, and is configured to simultaneously drive at least a subset of the transmitter electrodes using a multitude of transmitter signals with unique frequencies. The processing system is also configured to receive, on the receiver electrode, a resulting signal, and demodulate, using the plurality of demodulators, the resulting signal to generate a multitude, of sensing signals. Each of the of the demodulators operates on a different frequency of the unique frequencies.

18 Claims, 5 Drawing Sheets

Performance Analysis 500

One Burst ADC Data 502

Frequency Spectrum of One Burst ADC Data 504

FIG. 5

MULTI-FREQUENCY-REGION TOUCH SENSING

TECHNICAL FIELD

The described embodiments relate generally to electronic devices, and more specifically, to touch sensors.

BACKGROUND

Input devices including touch sensor devices (e.g., touchpads or touch sensor devices) are widely used in a variety of electronic systems. A touch sensor device typically includes a sensing region, often demarked by a surface, in which the touch sensor device determines the presence, location and/or motion of one or more input objects. Touch sensor devices may be used to provide interfaces for the electronic system. For example, touch sensor devices are often used as input devices for larger computing systems (such as opaque touchpads integrated in, or peripheral to, notebook or desktop computers). Touch sensor devices exist in different sizes. The number of sensor electrodes in a touch sensor device may depend on the size of the touch sensor device. The number of sensor electrodes in a larger touch sensor device may pose a challenge, particularly when a higher temporal resolution of the touch sensing is desired.

SUMMARY

In general, in one aspect, one or more embodiments relate to an input device, comprising: a plurality of transmitter electrodes disposed in a sensing region of the input device; a receiver electrode in the sensing region; and a processing system comprising a plurality of demodulators, the processing system configured to: simultaneously drive at least a subset of the plurality of transmitter electrodes using a plurality of transmitter signals with unique frequencies; receive, on the receiver electrode, a resulting signal; and demodulate, using the plurality of demodulators, the resulting signal to generate a plurality of sensing signals, wherein each of the plurality of demodulators operates on a different frequency of the unique frequencies.

In general, in one aspect, one or more embodiments relate to a processing system for an input device, the processing system comprising a plurality of demodulators and configured to: simultaneously drive at least a subset of the plurality of transmitter electrodes using a plurality of transmitter signals with unique frequencies, wherein the plurality of transmitter electrodes is disposed in a sensing region of the input device; receive, on a receiver electrode in the sensing region, a resulting signal; and demodulate, using the plurality of demodulators, the resulting signal to generate a plurality of sensing signals, wherein each of the plurality of demodulators operates on a different frequency of the unique frequencies.

In general, in one aspect, one or more embodiments relate to a method for operating an input device, the method comprising simultaneously driving at least a subset of a plurality of transmitter electrodes using a plurality of transmitter signals with unique frequencies; receiving, on a receiver electrode, a resulting signal, wherein the plurality of transmitter electrodes and the receiver electrode are disposed in a sensing region of the input device; demodulating, using a plurality of demodulators, the resulting signal to generate a plurality of sensing signals, wherein each of the plurality of demodulators operates on a different frequency of the unique frequencies; and performing a touch sensing, using the resulting signal.

Other aspects of the embodiments will be apparent from the following description and the appended claims.

DETAILED DESCRIPTION

The following detailed description is exemplary in nature and is not intended to limit the invention or the application and uses of the invention. Furthermore, there is no intention to be bound by any expressed or implied theory presented in the preceding technical field, background, brief summary, brief description of drawings, or the following detailed description.

Throughout the application, ordinal numbers (e.g., first, second, third, etc.) may be used as an adjective for an element (i.e., any noun in the application). With the exception of the four consecutive quarter cycles, the use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

The use of the ordinal numbers with respect to the four consecutive quarter cycles denote an ordering within the four consecutive quarter cycle. In particular, the first consecutive quarter cycle is an initial quarter cycle that precedes the second consecutive quarter cycle. The second consecutive quarter cycle precedes the third consecutive quarter cycle, which, in turn, precedes the fourth (i.e., last) consecutive quarter cycle.

Various embodiments provide input devices and methods that facilitate improved usability along with various other benefits. Embodiments of the disclosure may be used to provide high frame rates for touch sensing even for larger sensing regions. Embodiments of the disclosure simultaneously drive multiple sensing electrodes in the sensing region using transmitter signals with different frequencies. The simultaneous driving of multiple sensing electrodes can be performed in a shorter time interval than a sequential driving of the same number of sensing electrodes. Accordingly, a higher number of sensing operations may be performed during a fixed time interval. Thus, a touch sensing may be performed for larger sensing regions, without an undesirable or unacceptable reduction of the frame rate used for the sensing. Similarly, frame rates may be increased for smaller sensing regions when using the simultaneous driving of multiple sensing electrodes. A detailed description is subsequently provided.

Figure 1:
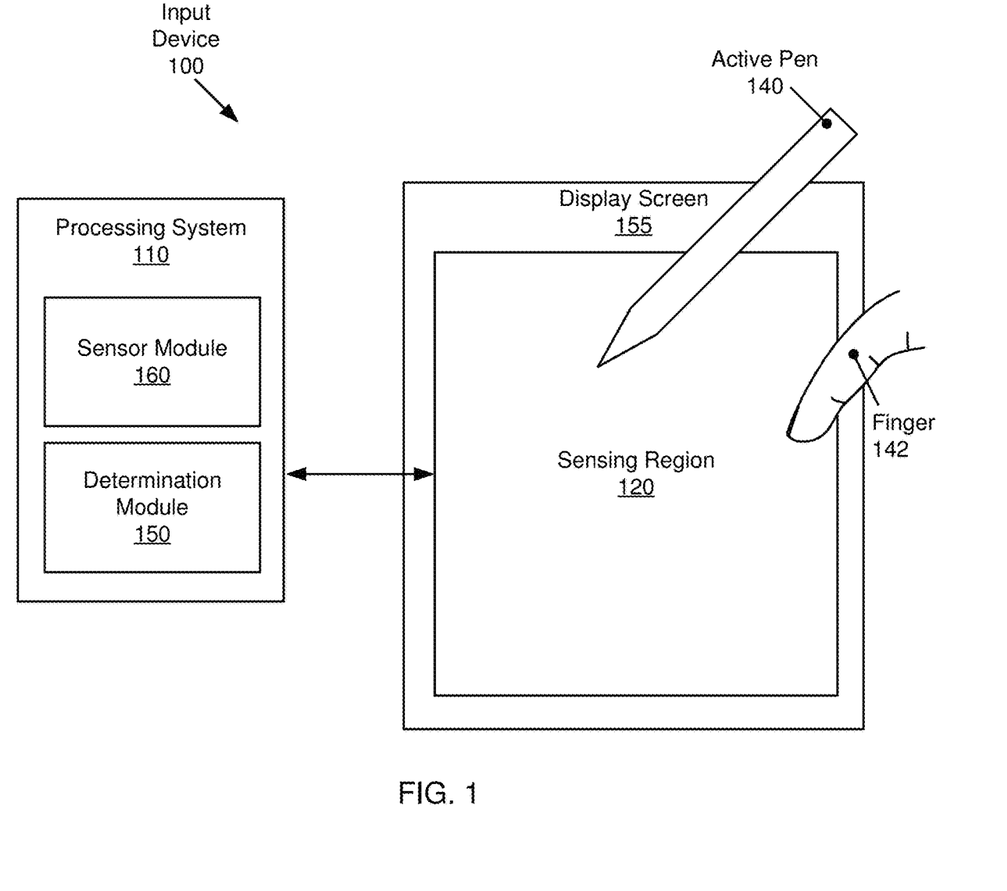
FIG. 1 shows a block diagram of an input device, in accordance with one or more embodiments.

FIG. 1 is a block diagram of an exemplary input device (100), in accordance with embodiments. The input device (100) may be configured to provide input to an electronic system (not shown). As used in this document, the term "electronic system" (or "electronic device") broadly refers to any system capable of electronically processing information. Some non-limiting examples of electronic systems include personal computers, such as desktop computers, laptop computers, netbook computers, tablets, web browsers, e-book readers, and personal digital assistants (PDAs). Additional example electronic systems include composite input devices, such as physical keyboards that include input device (100) and separate joysticks or key switches. Further example electronic systems include peripherals, such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

In FIG. 1, the input device (100) is shown as a touch sensor device (e.g., "touchpad" or a "touch sensor device") configured to sense input provided by one or more input objects in a sensing region (120). Example input objects include styli, an active pen (140), and fingers (142). Further, which particular input objects are in the sensing region may change over the course of one or more gestures. For example, a first input object may be in the sensing region to perform the first gesture, subsequently, the first input object and a second input object may be in the above surface sensing region, and, finally, a third input object may perform the second gesture. To avoid unnecessarily complicating the description, the singular form of input object is used and refers to all of the above variations.

The sensing region (120) encompasses any space above, around, in and/or near the input device (100) in which the input device (100) is able to detect user input (e.g., user input provided by one or more input objects). The sizes, shapes, and locations of particular sensing regions may vary widely from embodiment to embodiment.

The input device (100) may use any combination of sensor components and sensing technologies to detect user input in the sensing region (120). The input device (100) includes one or more sensing elements for detecting user input. The sensing elements may be capacitive.

In some capacitive implementations of the input device (100), voltage or current is applied to create an electric field. Nearby input objects cause changes in the electric field and produce detectable changes in capacitive coupling that may be detected as changes in voltage, current, or the like.

Some capacitive implementations utilize arrays or other regular or irregular patterns of capacitance sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g., system ground), and by detecting the capacitive coupling between the sensor electrodes and input objects. The reference voltage may by a substantially constant voltage or a varying voltage and in various embodiments; the reference voltage may be system ground. Measurements acquired using absolute capacitance sensing methods may be referred to as absolute capacitive measurements.

Some capacitive implementations utilize "mutual capacitance" (or "trans capacitance") sensing methods based on changes in the capacitive coupling between sensor electrodes. In various embodiments, an input object near the sensor electrodes alters the electric field between the sensor electrodes, thus changing the measured capacitive coupling. In one implementation, a mutual capacitance sensing method operates by detecting the capacitive coupling between one or more transmitter sensor electrodes (also "transmitter electrodes" or "transmitter") and one or more receiver sensor electrodes (also "receiver electrodes" or "receiver"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. The reference voltage may be a substantially constant voltage and in various embodiments; the reference voltage may be system ground.

In some embodiments, transmitter sensor electrodes and receiver sensor electrodes may both be modulated. The transmitter electrodes may be modulated relative to the receiver electrodes to transmit transmitter signals and to facilitate receipt of resulting signals. A resulting signal may include effect(s) corresponding to one or more transmitter signals, and/or to one or more sources of environmental interference (e.g., other electromagnetic signals). The effect(s) may be the transmitter signal, a change in the transmitter signal caused by one or more input objects and/or environmental interference, or other such effects. Sensor electrodes may be dedicated transmitters or receivers or may be configured to both transmit and receive. Measurements acquired using mutual capacitance sensing methods may be referred to as mutual capacitance measurements.

In FIG. 1, a processing system (110) is shown as part of the input device (100). The processing system (110) is configured to operate the hardware of the input device (100) to detect input in the sensing region (120). The processing system (110) includes parts of or all of one or more integrated circuits (ICs) and/or other circuitry components. For example, a processing system (110) for a mutual capacitance sensor device may include transmitter circuitry configured to transmit signals with transmitter sensor electrodes, and/or receiver circuitry configured to receive signals with receiver sensor electrodes. Further, a processing system (110) for an absolute capacitance sensor device may include driver circuitry configured to drive absolute capacitance signals onto sensor electrodes, and/or receiver circuitry configured to receive signals with those sensor electrodes. In one or more embodiments, a processing system (110) for a combined mutual and absolute capacitance sensor device may include any combination of the above described mutual and absolute capacitance circuitry. A processing system (110) may further include receiver circuitry configured to receive signals emitted by a different source, e.g., an active pen (140). The signals by the active pen (140) may be received by the receiver sensor electrodes, while transmit signals are not necessarily emitted by transmitter sensor electrodes.

In some embodiments, the processing system (110) also includes electronically-readable instructions, such as firmware code, software code, and/or the like. In some embodiments, components composing the processing system (110) are located together, such as near sensing element(s) of the input device (100). In other embodiments, components of processing system (110) are physically separate with one or more components close to the sensing element(s) of the input device (100), and one or more components elsewhere. For example, the input device (100) may be a peripheral coupled to a computing device, and the processing system (110) may include software configured to run on a central processing unit of the computing device and one or more ICs (perhaps with associated firmware) separate from the central processing unit. As another example, the input device (100) may be physically integrated in a mobile device, and the processing system (110) may include circuits and firmware that are part of a main processor of the mobile device. In some embodiments, the processing system (110) is dedicated to implementing the input device (100). In other embodiments, the processing system (110) also performs other functions, such as operating display screens (155), driving haptic actuators, etc.

The processing system (110) may be implemented as a set of modules that handle different functions of the processing system (110). Each module may include circuitry that is a part of the processing system (110), firmware, software, or a combination thereof. In various embodiments, different combinations of modules may be used. For example, as shown in FIG. 1, the processing system (110) may include a determination module (150) and a sensor module (160). The determination module (150) may include functionality to determine when at least one input object is in a sensing region, signal to noise ratio, positional information of an input object, a gesture, an action to perform based on the gesture, a combination of gestures or other information, and/or other operations.

The sensor module (160) may include functionality to drive the sensing elements to transmit transmitter signals and receive the resulting signals. For example, the sensor module (160) may include sensory circuitry that is coupled to the sensing elements. The sensor module (160) may include, for example, a transmitter module and a receiver module. The transmitter module may include transmitter circuitry that is coupled to a transmitting portion of the sensing elements. The receiver module may include receiver circuitry coupled to a receiving portion of the sensing elements and may include functionality to receive the resulting signals. The receiver module of the sensor module (160) may receive resulting signals from sensor electrodes in the electrode pattern using a capacitive sensing signal having a sensing frequency, e.g., generated by the transmitter module. The resulting signals may include desired signals, such as active pen data or signal components caused by an input object being in proximity to the electrode pattern, or undesired signals, such as noise or interference. As will be described in greater detail below, the sensor module (160) may perform one or more demodulation operations on the resulting signal.

Although FIG. 1 shows a determination module (150) and a sensor module (160), alternative or additional modules may exist in accordance with one or more embodiments. Such alternative or additional modules may correspond to distinct modules or sub-modules than one or more of the modules discussed above. Example alternative or additional modules include hardware operation modules for operating hardware such as sensor electrodes and display screens (155), data processing modules for processing data such as sensor signals and positional information, reporting modules for reporting information, and identification modules configured to identify gestures, such as mode changing gestures, and mode changing modules for changing operation modes. Further, the various modules may be combined in separate integrated circuits. For example, a first module may be comprised at least partially within a first integrated circuit and a separate module may be comprised at least partially within a second integrated circuit. Further, portions of a single module may span multiple integrated circuits. In some embodiments, the processing system as a whole may perform the operations of the various modules.

In some embodiments, the processing system (110) responds to user input (or lack of user input) in the sensing region (120) directly by causing one or more actions. Example actions include changing operation modes, as well as graphical user interface (GUI) actions such as cursor movement, selection, menu navigation, and other functions. In some embodiments, the processing system (110) provides information about the input (or lack of input) to some part of the electronic system (e.g., to a central processing system of the electronic system that is separate from the processing system (110), if such a separate central processing system exists). In some embodiments, some part of the electronic system processes information received from the processing system (110) to act on user input, such as to facilitate a full range of actions, including mode changing actions and GUI actions.

In some embodiments, the input device (100) includes a touch screen interface, and the sensing region (120) overlaps at least part of an active area of a display screen (155). For example, the input device (100) may include substantially transparent sensor electrodes overlaying the display screen and provide a touch screen interface for the associated electronic system. The display screen may be any type of dynamic display capable of displaying a visual interface to a user and may include any type of light emitting diode (LED), organic LED (OLED), cathode ray tube (CRT), liquid crystal display (LCD), plasma, electroluminescence (EL), or other display technology. The input device (100) and the display screen (155) may share physical elements. For example, some embodiments may utilize some of the same electrical components for displaying and sensing. In various embodiments, one or more display electrodes of a display device may be configured for both display updating and input sensing. As another example, the display screen (155) may be operated in part or in total by the processing system (110).

While FIG. 1 shows a configuration of components, other configurations may be used without departing from the scope of the disclosure. For example, various components may be combined to create a single component. As another example, the functionality performed by a single component may be performed by two or more components. Further, while a configuration for touch sensing is described, other variables such as force may be sensed.

Figure 2:
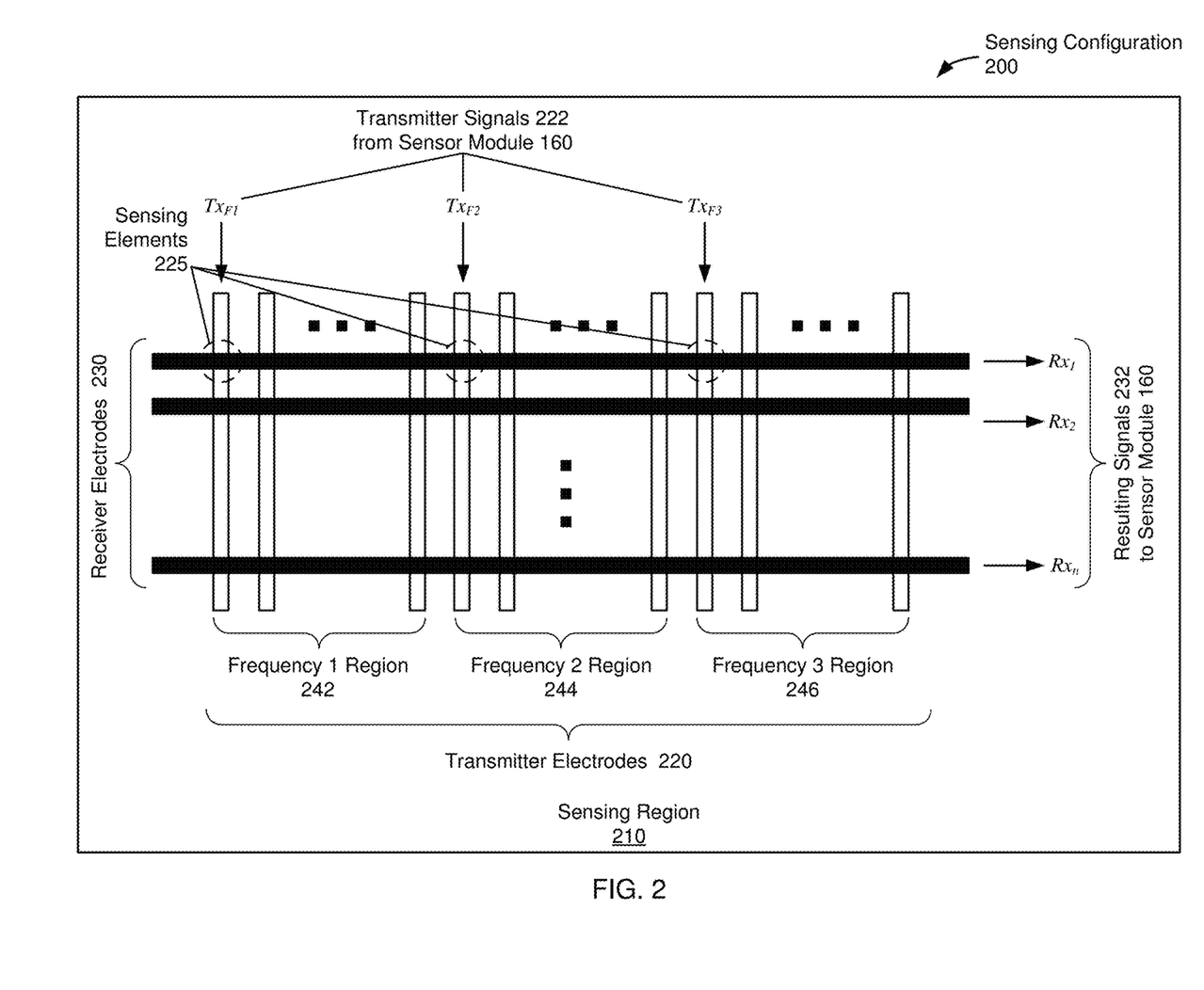
FIG. 2 shows a sensing configuration, in accordance with one or more embodiments.

FIG. 2 shows a sensing configuration (200), in accordance with one or more embodiments. The sensing configuration (200) is based on an arrangement of sensor electrodes in a sensing region (120). Transmitter (Tx) electrodes (220) and receiver (Rx) electrodes (230) may be disposed in the sensing region (120). In the example of FIG. 2, the Tx electrodes (220) are elongated rectangular structures arranged in columns, whereas the Rx electrodes (230) are elongated rectangular structures arranged in rows. Generally, Tx and Rx electrodes of any shape may be used.

In one or more embodiments, the Tx electrodes (220) and the Rx electrodes (230), together, implement mutual capacitance or transcapacitance sensing. At the intersection of a Tx (220) and an Rx (230) electrode, a localized capacitive coupling is formed between a portion of the Tx electrode (220) and the Rx electrode (230). The region of this localized capacitive coupling may be termed a "capacitive pixel," or also referred to herein as the sensing element (225). A transcapacitance Ct is associated with the sensing element (225). When an input object (not shown) approaches the sensing element (225), the transcapacitance Ct may change by an amount ΔCt. A presence or absence of the input object may thus be detected by monitoring ΔCt. ΔCt may be measured by driving a transmitter signal (222) onto the Tx electrode (220) and receiving a resulting signal (232) from the Rx electrode (230). The resulting signal is a function of the transmitter signal and ΔCt due to the presence or absence of an input object. A ΔCt may be obtained for multiple sensing elements to generate a capacitive image, e.g., spanning the entire sensing region (120).

In one or more embodiments, multiple Tx electrodes (220) are simultaneously driven. In the example of FIG. 2, when three Tx electrodes are simultaneously driven with the transmitter signals $Tx_{F1}$, $Tx_{F2}$, and $Tx_{F3}$ (222), the resulting signal (232) on each of the Rx electrodes $Rx_1 \ldots Rx_n$ (230) would be affected by $Tx_{F1}$, $Tx_{F2}$, and $Tx_{F3}$. Each of the resulting signals (232), thus, may carry information about a presence or absence of an input object in proximity to three sensing elements (225).

Figure 3:
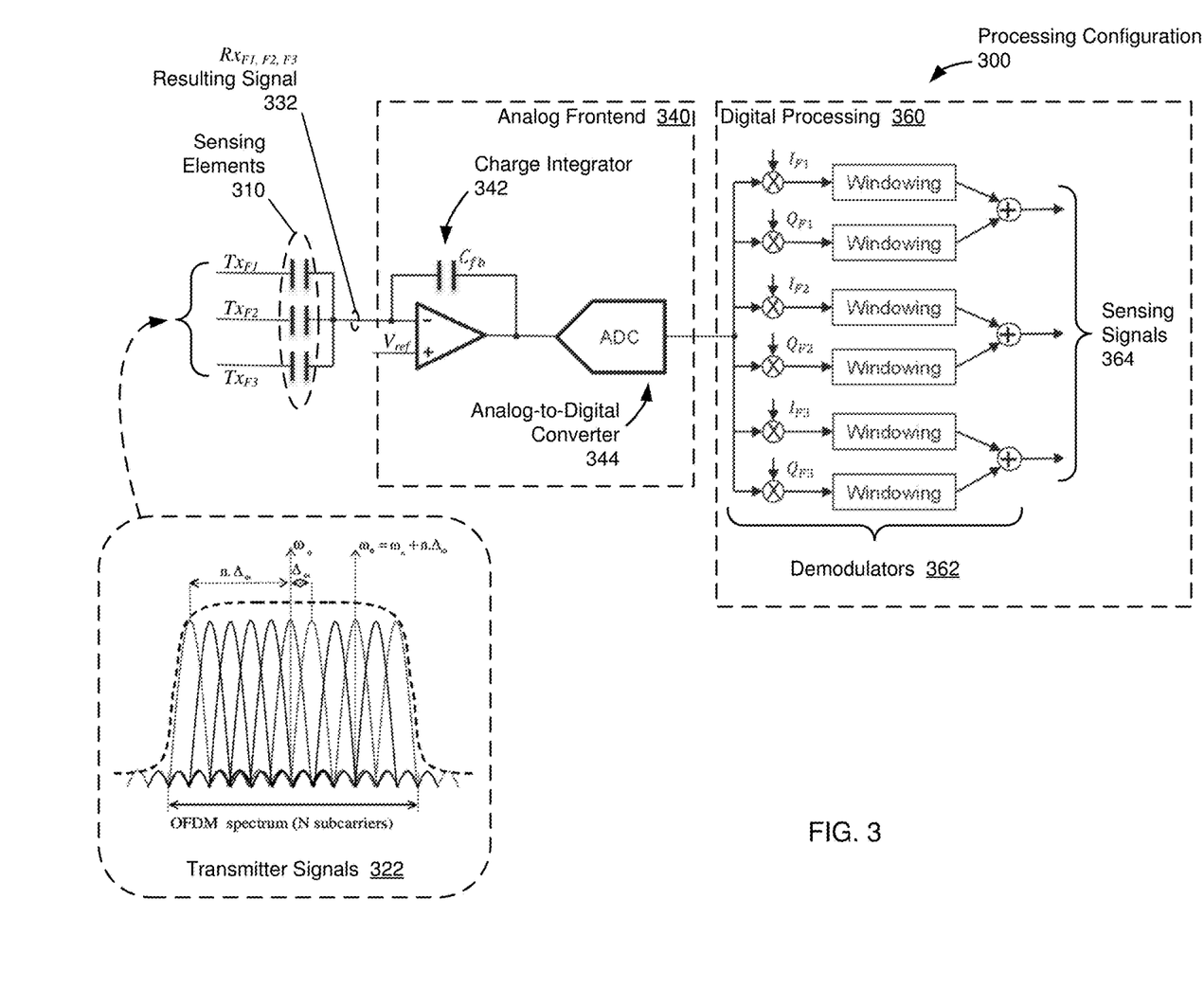
FIG. 3 shows a processing configuration, in accordance with one or more embodiments.

As described in reference to FIG. 3, a demodulation may be performed such that a sensing signal is obtained, separately for each of the three sensing elements (225). The described operations may be performed for each of the resulting signals (232) on the Rx electrodes $Rx_1 \ldots Rx_n$ (230). To obtain a complete capacitive image, the operations may then be repeated for another set of three Tx electrodes, using the same $Tx_{F1}$, $Tx_{F2}$, and $Tx_{F3}$. The repetitions may be continued until all of the Tx electrodes (220) have been driven. For the purpose of driving the Tx electrodes (220), the Tx electrodes may be grouped by frequency regions. Based on the use of three frequencies for the simultaneous driving in the example of FIG. 2, the sensing configuration (200) includes three frequency regions (242, 244, and 246).

Each of the three frequency regions (242, 244, 246) includes an identical or near identical number of Tx electrodes. For example, if the sensing configuration (200) includes 60 Tx electrodes, each of the frequency regions (242, 244, 246) may contain 20 Tx electrodes. One Tx electrode from each group may be selected for the simultaneous driving. For example, as shown in FIG. 2, the leftmost Tx electrode in each of the frequency regions (242, 244, 246) is selected for the simultaneous driving. Next, the immediately adjacent Tx electrodes in each of the frequency regions (242, 244, 246) may be selected for the simultaneous driving. A complete capacitive image may be obtained once all Tx electrodes (220) in all three frequency regions (242, 244, 246) have been driven once, and the corresponding resulting signals (232) have been received on the Rx electrodes (230).

In one or more embodiments, multiple Tx electrodes (220) are simultaneously driven. In the example of FIG. 2, assume that multiple Tx electrodes in frequency 1 region (242) are simultaneously driven with multiple Tx electrodes in frequency 2 region (244) and with multiple Tx electrodes in frequency 3 region (246). The simultaneously driven Tx electrodes in the frequency 1 region (242) may be driven with transmitter signals having a first frequency, the simultaneously driven Tx electrodes in the frequency 2 region (244) may be driven with a transmitter signal having a second frequency, and the simultaneously driven Tx electrodes in the frequency 3 region (246) may be driven with a transmitter signal having a third frequency. If the frequencies of the transmitter signals are selected to satisfy certain orthogonality principles (discussed below in reference to FIG. 3), then a signal processing may be performed separately for the different frequency regions with no or minimal interference. To enable a localization of a touch at a particular sensing element (225), a repeated driving may be performed using bursts of the transmitter signals (222), as described in the following example. In the example, assume that there are 20 Tx electrodes (220) per frequency region (242, 244, 246), i.e., a total of 60 Tx electrodes assuming three frequency regions. Accordingly, in the example, there are 20 sensing elements (225) per Rx electrode intersecting with the 20 Tx electrodes, per frequency region. In order to be able to evaluate the presence or absence of touch at each of the 20 sensing elements (225), the 20 Tx electrodes may be simultaneously driven 20 times in sequence, using a burst pattern of 20 sequential bursts that allows for a unique solution of a system of equations with 20 unknowns. While the frequency of the transmitter signals used within a sensing region may be the same for the entire burst pattern, the phase of the transmitter signals may be varied across subsequent bursts and across the Tx electrodes being driven, within the burst pattern. By processing the resulting signal (232) obtained on a single Rx electrode in response to the 20 bursts on all 20 TX electrodes, a ΔCt may be determined for each of the sensing elements. The same operations may be simultaneously performed for all resulting signals (232) on all Rx electrodes (230). The same operations may further be simultaneously performed in the other frequency regions. Accordingly, in the example with three frequency regions, a total of 60 Tx electrodes may be simultaneously driven, each with a sequence of 20 bursts of a transmitter signal.

In the example of FIG. 2, the simultaneous driving of the Tx electrodes (220) can reduce the time required for acquiring a complete capacitive image by a factor of three, assuming that no other parameters are adjusted. To illustrate, assuming the required frame rate is 240 fps for a 17" touch screen having 60 Tx electrodes, the time available for driving the Tx electrodes with a burst of the transmitter signal would be limited to 1/(240×60)=70 μs, which may result in poor noise immunity. In contrast, when simultaneously driving sets of Tx electrodes across the three frequency regions, the time available for driving the Tx electrodes would be 1/(240×20)=210 μs per burst, which may provide superior noise immunity without reducing the frame rate. The same may be true when operating smaller touch screens at even higher frame rates, e.g., 480 fps or 600 fps.

While FIG. 2 shows a particular sensing configuration, and the example describes a specific touch screen scenario, embodiments of the disclosure may be used in conjunction with many different configurations. For example, embodiments of the disclosure may use different types of electrode arrangements, may simultaneously drive fewer or more Tx electrodes, may be for a larger or smaller sensing region, etc. While FIG. 2 suggests a particular order for simultaneously driving sets of three Tx electrodes (220), any order for driving the Tx electrodes may be used, without departing from the disclosure. Further, while FIG. 2 shows a particular configuration of the frequency regions (242, 244, 246), the frequency regions may be configured differently. For example, the frequency regions do not need to be contiguous, an equal number of Tx electrodes may be randomly assigned to the frequency regions, and so on.

FIG. 3 shows a processing configuration (300), in accordance with one or more embodiments. The processing configuration (300) may be used in conjunction with the sensing configuration (200) of FIG. 2. Specifically, in the example shown in FIG. 3, transmitter signals with three different frequencies are simultaneously emitted to drive the Tx electrodes (220) (e.g., as shown in FIG. 2). FIG. 3 shows the processing of the resulting signal (332) obtained on one of the Rx electrodes (230). In order to process multiple resulting signals on multiple Rx electrodes, the processing configuration (300) may be implemented multiple times to operate in parallel. For example, for n Rx electrodes, the components shown in FIG. 3 may be implemented n times.

The processing configuration (300) includes an analog frontend (340) and a digital processing block (360). The analog frontend (340) may include a charge integrator (342) and an analog-to-digital converter (ADC) (344). The digital processing block (360) may include operations that implement a set of demodulators (362). In the example shown, the digitally implemented set of demodulators (362) demodulates the resulting signal (332) obtained by the analog frontend (340) to generate the sensing signals (364). The sensing signals (364) may provide a measure for the transcapacitance at the three sensing elements (225) and may thus be indicative of the presence or absence of an input object (not shown). Additional downstream operations may be performed on the sensing signals (364) to perform a touch sensing. A detailed description is subsequently provided.

In one or more embodiments, the transmitter signals (322) for simultaneously driving a set of transmitter electrodes (230) have different frequencies. More specifically, each of the simultaneously driven transmitter electrodes is driven by a transmitter signal (322) with one unique frequency. In one or more embodiments, the transmitter signals (322) used for the simultaneous driving are orthogonal. In one or more embodiments the transmitter signals (322) used for the simultaneous driving are selected from an orthogonal frequency-division multiplexing (OFDM) spectrum of subcarriers, as illustrated in FIG. 3. FIG. 3 shows an OFDM spectrum example with eleven subcarriers. Any of the subcarriers may be used due to the orthogonality of the subcarriers. For example, the subcarrier at c00 and the subcarriers immediately to the left and to the right may be selected to obtain transmitter signals (322) with three different frequencies. Bursts of the transmitter signals (322) may then be used to simultaneously drive the Tx electrodes (220) in the sensing region (120). A first of the three frequencies may be used to drive Tx electrodes in the frequency 1 region (242), a second of the three frequencies may be used to drive Tx electrodes in the frequency 2 region (244), and a third of the three frequencies may be used to drive Tx electrodes in the frequency 3 region (246). While only one frequency may be used within a frequency region, the phase of the transmitter signals within the frequency region may be varied between electrodes and/or between subsequent bursts of the transmitter signal. In one embodiment, the phase is altered by 180° to use the transmitter signal and an inverted transmitter signal for the driving of the Tx electrodes. Any other phase change may be used without departing from the disclosure.

A single resulting signal $Rx_{F1, F2, F3}$ (332) may be obtained from one Rx electrode (232) for further processing. The resulting signal $Rx_{F1, F2, F3}$ (332) may include the effects of the transmitter signals (322) emitted at all sensing elements (225) associated with Tx electrodes that are driven with the transmitter signals having three different frequencies and different phases. An example is provided in FIG. 5. The resulting signal $Rx_{F1, F2, F3}$ (332) may further include the effect of the presence or absence of an input object at the sensing elements (225).

The charge integrator (342) receives the resulting signal $Rx_{F1, F2, F3}$ (332) and may integrate the resulting signal $Rx_{F1, F2, F3}$ (332) over an integration time interval. The ADC (344) receives the resulting signal $Rx_{F1, F2, F3}$ (332) after the integration and performs an analog-to-digital conversion. An additional discussion of the ADC is provided below.

The output of the ADC is provided to a set of digitally implemented demodulators (362). In one or more embodiments, the demodulators (362) are configured to generate the sensing signals (364). In one or more embodiments, the demodulators (362) include a demodulator for an in-phase (I) demodulation and a quadrature (Q) demodulation specific to each of the unique frequencies of the three transmitter signals (322). In other words, there may be six demodulators (three I demodulators and three Q demodulators) configured to perform three I/Q demodulations, as shown in FIG. 3. Each of the six demodulators may include a multiplier operation and a windowing operation, to generate the I and Q components of the sensing signals. The multiplier may multiply the input of the multiplier (i.e., the integrated, analog-to-digital converted resulting signal $Rx_{F1, F2, F3}$ (332) with a demodulation waveform to perform a demodulation. The windowing operation may provide a low pass filtering such as a weighted average of the mixer result (obtained from the multiplier operation). The demodulation waveform may be based on the transmitter signals (322).

Specifically, each of the multipliers may be provided with a copy of one of the three transmitter signals (322) to cause demodulation at the frequency of the provided transmitter signal. Accordingly, the demodulators (362), in combination, perform a code division multiplexing (CDM) decoding at each of the three frequencies to separate the sensing signals (364) associated with the three sensing elements (225). The demodulated I and Q components of the sensing signal associated with a sensing element may be combined to obtain an acceptably accurate sensing signal, even in presence of possible phase shifts.

Using the combined I and Q demodulations, a precise phase alignment between the integrated, analog-to-digital converted resulting signal $Rx_{F1, F2, F3}$ (332) and the demodulation waveform is not necessary to perform the demodulation. As a result, the ADC (344) may be relatively low-speed, for example, three to five times the speed of the transmitter signal frequency. This may result in the introduction of a phase offset which is, however, mitigated by the use of the combined I and Q demodulations. The use of a low-speed ADC reduces power consumption and cost, whereas the additional Q demodulator is associated with negligible additional cost and power consumption, because it is digitally implemented. Accordingly, the described configuration using a digital I/Q demodulation and an analog-to-digital conversion prior to the demodulation is cost effective and energy efficient. While a digital I/Q demodulation is described, an analog I/Q demodulation may be performed, followed by an analog-to-digital conversion, without departing from the disclosure.

In one embodiment, only I demodulators (no Q demodulators) are used to perform the demodulation. To obtain a reasonably precise phase alignment using only I demodulators, a faster ADC (344) may be used to reduce a possible phase offset. For example, the ADC may operate at at least 16 times the speed of the transmitter signal frequency.

While FIG. 3 shows a particular processing configuration, other configurations may be used, without departing from the disclosure. For example, while FIG. 3 shows the simultaneous driving of three Tx electrodes using transmitter signals with three unique frequencies, any number of Tx electrodes may be simultaneously driven. Further, while FIG. 3 shows a processing configuration for processing a single resulting signal obtained from three Rx electrodes, the analog and digital processing components as shown may be replicated to process additional resulting signals.

Figure 4:
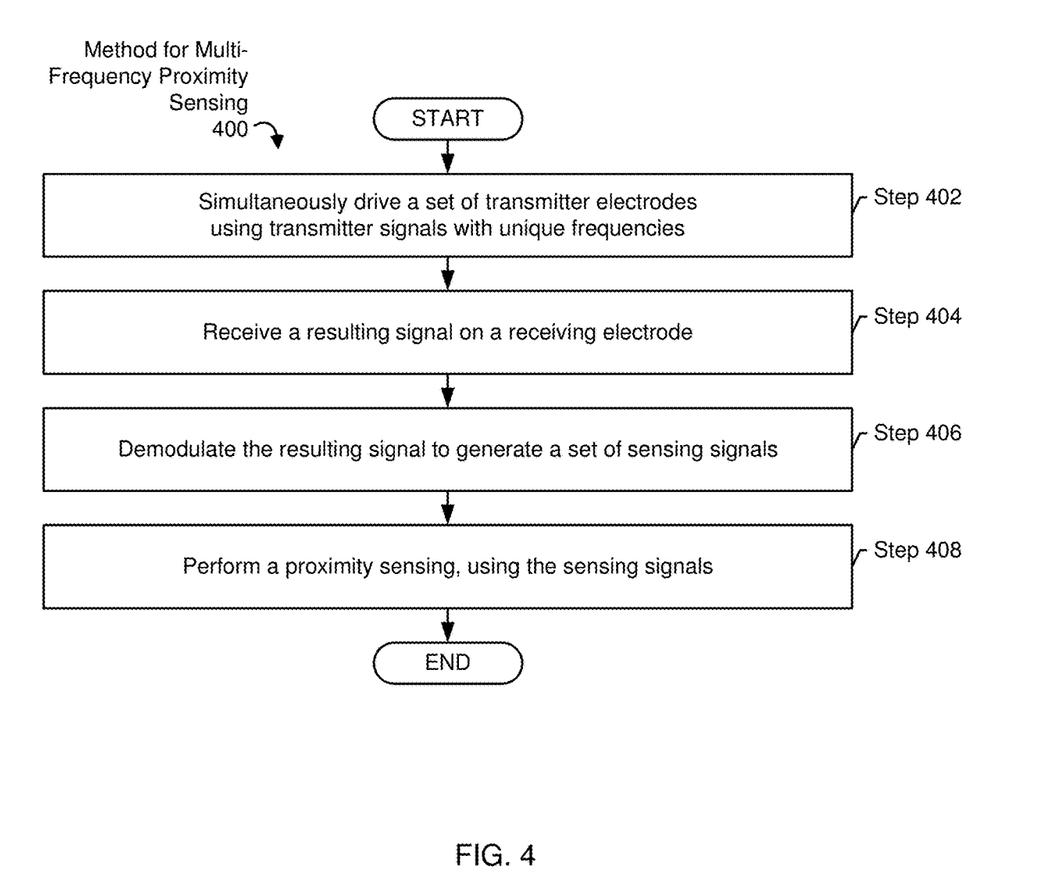
FIG. 4 shows a flowchart describing a method for multi-frequency-region touch sensing, in accordance with one or more embodiments.

FIG. 4 shows a flowchart in accordance with one or more embodiments. One or more of the steps in FIG. 4 may be performed by the components discussed above in reference to FIG. 1, FIG. 2, and FIG. 3. While the various steps in this flowchart are presented and described sequentially, one of ordinary skill will appreciate that at least some of the blocks may be executed in different orders, may be combined, or omitted, and some of the blocks may be executed in parallel. Additional steps may further be performed. Accordingly, the scope of the disclosure should not be considered limited to the specific arrangement of steps shown in FIG. 4.

The flowchart of FIG. 4 depicts a method (400) for multi-frequency-region touch sensing, in accordance with one or more embodiments.

In Step 402, a set of Tx electrodes is simultaneously driven using multiple transmitter signals with unique frequencies. Any number of Tx electrodes may be simultaneously driven. Additional details are provided in reference to FIG. 2 and FIG. 3.

In Step 404, a resulting signal is obtained on an Rx electrode. Step 404 may be performed in parallel with Step 402. Further, Step 404 may be performed for multiple Rx electrodes simultaneously. The resulting signal received on an Rx electrode is affected by the multiple transmitter signals coupled onto the Rx electrode. The coupling occurs where the Rx electrode is in close spatial proximity to the Tx electrodes (e.g., at the sensing elements where the Tx electrodes intersect with the Rx electrode). The resulting signal is also affected by the presence or absence of an input object in proximity to the sensing elements because the capacitive coupling is affected by the presence or absence of the input object.

In Step 406, the resulting signal is demodulated to generate a set of sensing signals. One sensing signal may be obtained for each of one or more Tx electrodes driven using a transmitter signal with a particular frequency. If both I demodulation and Q demodulation are performed, the resulting I and Q components of the sensing signal may be processed to determine an amplitude and/or phase of the sensing signal. Additional details are provided in reference to FIG. 2 and FIG. 3. Additional steps may be performed, prior to the demodulation. For example, the resulting signal may be integrated and/or analog-to-digital converted, as previously described. A solution for sensing signals specific to particular sensing elements may be obtained by solving for the sensing signals over the multiple bursts of the transmitter signal. For example, a unique solution may be obtained when 20 bursts are used for a configuration that includes 20 sensing elements. If Step 404 is performed for multiple Rx electrodes, then Step 406 may also be performed multiple times to demodulate each of the resulting signals associated with the multiple Rx electrodes.

The described steps may be repeated. For example, Steps 402-406 may be repeated while driving different sets of Tx electrodes selected from the Tx electrodes in the frequency regions, as previously described in reference to FIG. 2 and FIG. 3. A capacitive image with sensing signals for a complete set of sensing elements of the capacitive image may be available after performing Steps 402-406 for all Tx electrodes in a sensing region.

In Step 408, a touch sensing may be performed, using the sensing signal. The touch sensing may involve evaluating the sensing signal against a previously determined baseline value. An input object may be considered to be present in proximity to the sensing element corresponding to the sensing signal if the sensing signal deviates from the baseline value by at least a certain amount. Step 408 may be performed for some or all sensing signals associated with the sensing elements of the capacitive image.

Steps 402-408 may be repeated, e.g., periodically, to perform a touch sensing over time.

Figure 5:
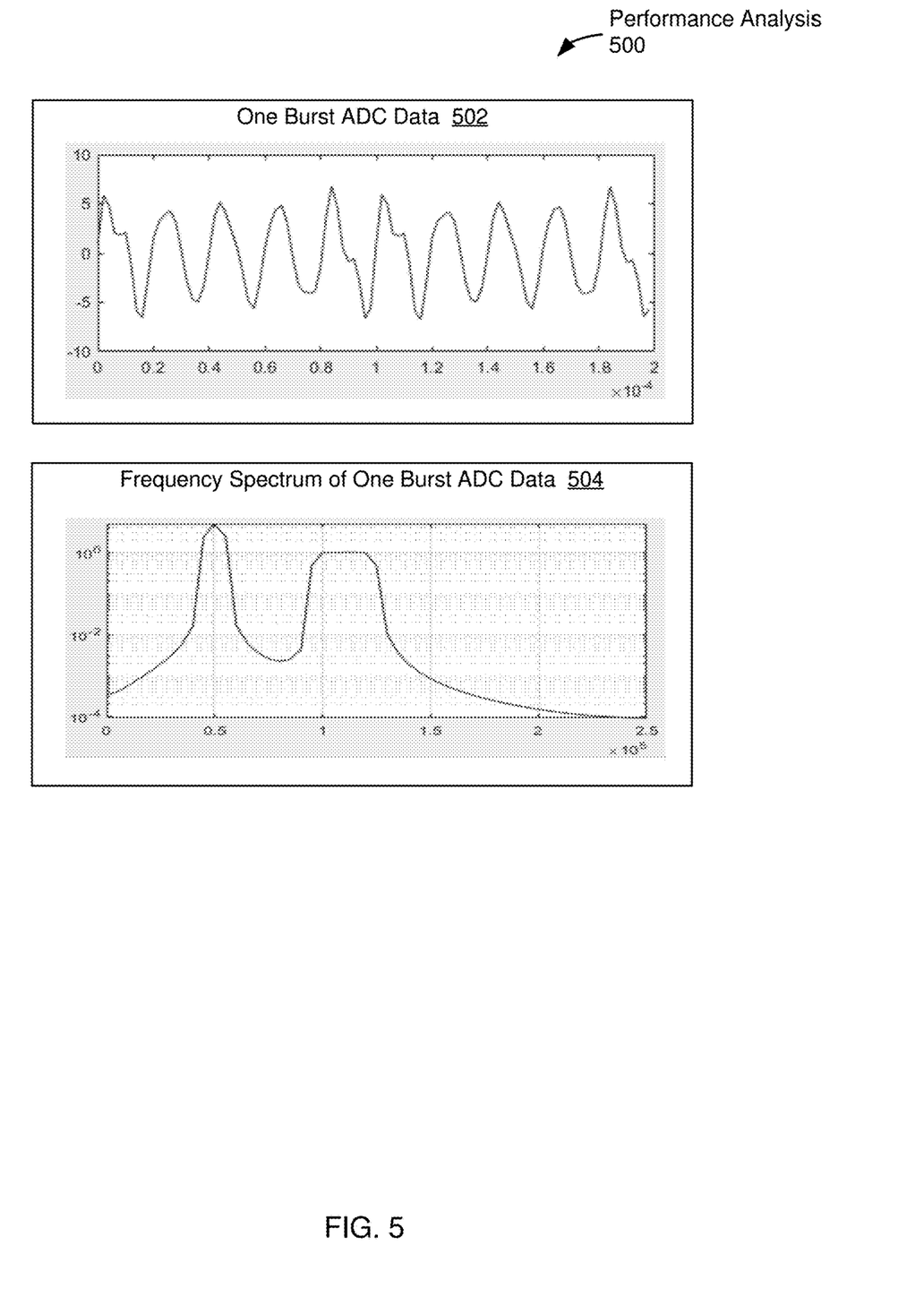
FIG. 5 shows sample data, in accordance with one or more embodiments.

FIG. 5 shows sample data (500), in accordance with one or more embodiments. The example is for three Tx electrodes that are simultaneously driven using three transmitter signals with three unique frequencies. The three frequencies are 100 kHz, 109.9 kHz, and 119.8 kHz. The three frequencies are selected from an OFDM spectrum (e.g., as shown in FIG. 3).

The resulting signal at an Rx electrode is shown in the time domain (502). The resulting signal is also shown in the frequency domain (504). The contributions by the three transmitter signals are clearly identifiable, although the resolution of the frequency spectrum (obtained using an FFT applied to a single burst of transmitter signals) is not sufficient to distinguish the three Tx frequencies. A contribution by a noise signal at 50 kHz is further visible.

Embodiments of the disclosure have various advantages. The use of simultaneously emitted transmitter signals with different frequencies enables touch sensing over larger sensing regions using relatively high frame rates without compromising noise immunity. Specifically, embodiments of the disclosure allow the driving of large numbers of Tx electrodes (which may be necessary for larger touch screens) at a high frame rate without shortening the burst of the emitted transmitter signals, because multiple transmitter electrodes may be simultaneously driven at different frequencies. Using burst lengths as proposed, a high degree of noise immunity is accomplished. Further, embodiments of the disclosure allow the addition of other bursts (e.g., for noise measurement, absolute capacitance sensing, etc.) without dramatically changing the timing. For example, in the example requiring 20 bursts per frame, the time required for completing a frame with an additional burst would increase by 5%. Embodiments of the disclosure are cost effective and energy efficient, for example, because relatively slow ADCs may be used and because numerous demodulation operations may be digitally performed using standard DSPs. Embodiments of the disclosure also allow the use of transmitter signals based on waveforms that include numerous harmonics. For example, trapezoidal waveforms may be used which may have multiple advantages in comparison to the use of sine waveforms, such as a relatively easy generation of higher voltages using transistor stacking, and the ability to operate using lower transmission power (because the amplitude of the base waveform is 1.27V, for a 1V square wave).

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An input device, comprising:
   transmitter electrodes disposed in a plurality of separate frequency regions in a sensing region of the input device, wherein each of the plurality of separate frequency regions comprises a plurality of the transmitter electrodes;
   a receiver electrode in the sensing region; and
   a processing system comprising a plurality of demodulators, the processing system configured to:
      simultaneously drive at least two of the plurality of transmitter electrodes in each of the plurality of separate frequency regions using a plurality of transmitter signals with unique frequencies;
      receive, on the receiver electrode, a resulting signal; and
      demodulate, using the plurality of demodulators, the resulting signal to generate a plurality of sensing signals,
         wherein each of the plurality of demodulators operates on a different frequency of the unique frequencies, and
         wherein each of the plurality of separate frequency regions is specific to one of the unique frequencies.

2. The input device of claim 1,
   wherein simultaneously driving at least two of the plurality of transmitter electrodes in each of the plurality of separate frequency regions using the plurality of transmitter signals with unique frequencies comprises:
      simultaneously driving at least two of the plurality of transmitter electrodes in each of the plurality of separate frequency regions at one of the unique frequencies specific to the frequency region.

3. The input device of claim 1,
   wherein simultaneously driving at least two of the plurality of transmitter electrodes in each of the plurality of separate frequency regions using the plurality of transmitter signals with unique frequencies comprises:
      simultaneously driving at least two of the plurality of transmitter electrodes in a first of the plurality of separate frequency regions at a first of the unique frequencies while simultaneously driving at least two of the plurality of transmitter electrodes in a second of the plurality of separate frequency regions at a second of the unique frequencies.

4. The input device of claim 1, wherein the transmitter signals of the plurality of transmitter signals are orthogonal to one another.

5. The input device of claim 1, wherein the plurality of transmitter signals is selected from an orthogonal frequency-division multiplexing (OFDM) spectrum.

6. The input device of claim 1, wherein each of the plurality of demodulators comprises an in-phase (I) and a quadrature (Q) demodulator.

7. The input device of claim 1, wherein each of the plurality of demodulators is digitally implemented.

8. The input device of claim 1, further comprising:
   an analog-to-digital converter (ADC) operating on the resulting signal prior to the demodulating of the resulting signal.

9. A processing system for an input device,
   the processing system comprising a plurality of demodulators and configured to:
      simultaneously drive at least two of each of a plurality of transmitter electrodes disposed in a plurality of separate frequency regions in a sensing region of the input device using a plurality of transmitter signals with unique frequencies, wherein each of the plurality of separate frequency regions comprises a plurality of transmitter electrodes;
      receive, on a receiver electrode in the sensing region, a resulting signal; and
      demodulate, using the plurality of demodulators, the resulting signal to generate a plurality of sensing signals,
         wherein each of the plurality of demodulators operates on a different frequency of the unique frequencies, and
         wherein each of the plurality of separate frequency regions is specific to one of the unique frequencies.

10. The processing system of claim 9,
    wherein simultaneously driving at least two of each of the plurality of transmitter electrodes in each of the separate frequency regions using the plurality of transmitter signals with unique frequencies comprises:
       simultaneously driving at least two of each of the plurality of transmitter electrodes in each of the plurality of separate frequency regions at one of the unique frequencies specific to the frequency region.

11. The processing system of claim 9,
    wherein simultaneously driving at least two of each of the plurality of transmitter electrodes in each of the separate frequency regions using the plurality of transmitter signals with unique frequencies comprises:
       simultaneously driving at least two of the plurality of transmitter electrodes in a first of the plurality of separate frequency regions at a first of the unique frequencies while simultaneously driving at least two of the plurality of transmitter electrodes in a second of the plurality of separate frequency regions at a second of the unique frequencies.

12. The processing system of claim 9, wherein the transmitter signals of the plurality of transmitter signals are orthogonal to one another.

13. The processing system of claim 9, wherein the plurality of transmitter signals is selected from an orthogonal frequency-division multiplexing (OFDM) spectrum.

14. The processing system of claim 9, wherein each of the plurality of demodulators comprises an in-phase (I) and a quadrature (Q) demodulator.

15. The processing system of claim 9, wherein each of the plurality of demodulators is digitally implemented.

16. The processing system of claim 9, further comprising:
    an analog-to-digital converter (ADC) operating on the resulting signal prior to the demodulating of the resulting signal.

17. A method for operating an input device, the method comprising:
    simultaneously driving at least two of each of a plurality of transmitter electrodes disposed in a plurality of separate frequency regions in a sensing region of the input device using a plurality of transmitter signals with unique frequencies, wherein each of the plurality of separate frequency regions comprises a plurality of transmitter electrodes;
    receiving, on a receiver electrode, a resulting signal,
       wherein the receiver electrode is disposed in the sensing region of the input device;

demodulating, using a plurality of demodulators, the resulting signal to generate a plurality of sensing signals,
wherein each of the plurality of demodulators operates on a different frequency of the unique frequencies; and
wherein each of the plurality of separate frequency regions is specific to one of the unique frequencies; and
performing a touch sensing, using the resulting signal.

18. The method of claim 17 wherein the plurality of transmitter signals is selected from an orthogonal frequency-division multiplexing (OFDM) spectrum.

* * * * *

UNITED STATES PATENT AND TRADEMARK OFFICE
CERTIFICATE OF CORRECTION

PATENT NO. : 11,531,439 B1
APPLICATION NO. : 17/518307
DATED : December 20, 2022
INVENTOR(S) : Guozhong Shen et al.

It is certified that error appears in the above-identified patent and that said Letters Patent is hereby corrected as shown below:

On the Title Page

In the Abstract:
Item (57), Line 10, the words "generate a multitude, of sensing signals. Each of the of the" should read
-- generate a multitude of sensing signals. Each of the --.

Signed and Sealed this
Eighteenth Day of July, 2023

Katherine Kelly Vidal
*Director of the United States Patent and Trademark Office*